US008441766B2

(12) United States Patent
Pietrzyk et al.

(10) Patent No.: US 8,441,766 B2
(45) Date of Patent: May 14, 2013

(54) APPARATUS FOR FAULT TOLERANT DIGITAL OUTPUTS

(75) Inventors: Arthur P. Pietrzyk, Thompson, OH (US); Peter M. Delic, Willoughby, OH (US); William E. Waltz, Mentor, OH (US); Russell W. Brandes, Brunswick, OH (US); Dennis G. Schneider, New Berlin, WI (US); Louis L. Smet, Wauwatosa, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 852 days.

(21) Appl. No.: 12/539,665

(22) Filed: Aug. 12, 2009

(65) Prior Publication Data

US 2010/0123987 A1 May 20, 2010

Related U.S. Application Data

(60) Provisional application No. 61/115,795, filed on Nov. 18, 2008, provisional application No. 61/115,801, filed on Nov. 18, 2008, provisional application No. 61/115,807, filed on Nov. 18, 2008.

(51) Int. Cl.
*H05K 1/18* (2006.01)
*H05K 7/10* (2006.01)

(52) U.S. Cl.
USPC .............. 361/78; 361/729; 361/748; 361/760

(58) Field of Classification Search .................... 361/78, 361/729, 748, 760; 326/10
See application file for complete search history.

(56) References Cited

U.S. PATENT DOCUMENTS

| | | | | |
|---|---|---|---|---|
| 5,983,260 | A * | 11/1999 | Hauser et al. | 709/201 |
| 6,456,495 | B1 * | 9/2002 | Wieloch et al. | 361/729 |
| 7,483,778 | B2 * | 1/2009 | Armbruster et al. | 701/48 |
| 7,494,036 | B2 * | 2/2009 | Shima et al. | 227/131 |
| 2006/0015244 | A1 | 1/2006 | Hawkins et al. | |
| 2006/0116803 | A1 | 6/2006 | Ambruster et al. | |
| 2007/0200520 | A1 * | 8/2007 | Sakata | 318/373 |
| 2007/0213854 | A1 | 9/2007 | El-Sayed | |

OTHER PUBLICATIONS

European Search Report for EP 09176348, Feb. 26, 2010.
Siemens, Automation Systems S7-400H Fault-tolerant Systems Manual, Edition Jan. 2004, Chapter 7.

* cited by examiner

*Primary Examiner* — Rexford Barnie
*Assistant Examiner* — Zeev V Kitov
(74) *Attorney, Agent, or Firm* — Boyle Fredrickson, S.C.; R. Scott Speroff; John M. Miller

(57) ABSTRACT

An output termination board for a safety system is disclosed herein. The termination board provides simplified wiring between the output modules and the remote devices operated by the controller in the system. Redundant output signals are generated within each pair of output modules and combined such that one control signal is sent to each remote device. In addition, a program executing on the controller of the safety system performs a test to determine if each output module is operating normally. If the program detects a fault in either output module, the safety system may alternately shut down according to a fail-safe procedure or continue operating under a fault-tolerant mode of operation.

19 Claims, 2 Drawing Sheets

APPARATUS FOR FAULT TOLERANT DIGITAL OUTPUTS

CROSS-REFERENCE TO RELATED APPLICATIONS

This application claims the benefit of U.S. Provisional Application Nos. 61/115,795, 61/115,801, and 61/115,807. Each of the provisional applications entitled "Termination for Fault Tolerant I/O and AOI's for SIL 2 ControlLogix" was filed on Nov. 18, 2008 and is hereby incorporated by reference in its entirety.

BACKGROUND OF THE INVENTION

The subject matter disclosed herein relates to fault tolerant digital outputs for a safety control system. More specifically, the subject matter relates to a termination board for connecting remote devices to digital output signals from a controller, such as a programmable logic controller, for a safety system.

A Programmable Logic Controller (PLC) is a special purpose computer typically used for real-time control of an industrial machine or process. The PLC has a modular design such that it may be readily configured for numerous types of machines or processes across a wide variety of industries. The PLC includes a rack, or multiple racks, typically containing an integral power supply and multiple slots to plug in different modules. The rack further incorporates a backplane such that different modules may communicate with each other. A wide variety of modules exist to accommodate the wide variety of applications for a PLC. This modular design provides a cost benefit because standard modules may be developed that are mass produced and configurable according to the machine or process to be controlled.

Some of these standard modules include the processor module as well as input and output modules. The inputs and outputs may be digital, where the presence or absence of a DC voltage level indicates a logical one or zero, or analog, where a continuously variable input voltage represents a range of input data. The input and output modules may further include varying number of channels, for example eight, sixteen, or thirty-two, such that the PLC may be easily configured according to the machine or process to be controlled.

Industrial control systems differ from conventional computer systems in that they provide highly reliable operation and deterministic real-time control. In part, this requires that data communicated between the processor and the input and output modules be transmitted in a predictable sequence. Further, a program must execute on the PLC in a predictable sequence to execute the control functions of the PLC. This program is typically developed in "ladder logic," consisting of a series of "rungs." Each rung typically monitors one or more inputs or internal conditions on the input portion of the rung to determine whether to execute the output portion of the rung. The output portion of the rung may set an output channel, start an internal timer, or perform some other function. The program executes as a continuous loop where one loop through the program constitutes a scan of the program.

"Safety controllers" are also special purpose computers used to ensure the safety of humans working in the environment of an industrial process which may be implemented using a PLC. A safety controller may share some hardware, such as remote sensors and actuators, when used for machine control and safety; however, in a process application the safety controller operates independently of the process controller. Typically, a safety controller operates independently of a process controller and is connected to a separate set of sensors and actuators to monitor the process forming a safety control system. The safety control system monitors operation of the process and may initiate an orderly shutdown of the process if the primary process control system fails. The safety control system is designed to monitor the machine or process and to protect machine operators, technicians, or other individuals required to interact with the machine or process as well as protect the equipment itself. The safety control system monitors the process for a potentially unsafe operating condition which may be caused by an out of control process. If the safety system detects a potentially unsafe operating condition, the safety controller operates to put the machine or process into a safe state.

To this extent, a certification process has been established to provide Safety Integrity Level (SIL) ratings to equipment, identifying different degrees of safety. These ratings are determined by such factors as mean time between failures, probability of failure, diagnostic coverage, safe failure fractions, and other similar criteria. These safety ratings may be achieved, at least in part, by incorporating redundancy into the safety system along with a means of verifying operation of the redundant components.

For example, redundancy may be incorporated by wiring two output modules in series. In this configuration, an output channel in a first module enables the power to a corresponding output channel in a second module. The output channel in the second module, in turn, drives the remote device. Each channel on both output modules are commanded to change state together. While, such a configuration can prevent the failure of a single module from improperly commanding an actuator, for example by failing in an energized state, this configuration requires that both output modules remain functioning properly in order to control an actuator, preventing fault-tolerant operation. In other words, if one of the output modules fails, it must be replaced prior to continuing operation. Thus, it would be desirable to provide a redundant control system wherein the control system may optionally remain operational in the event one output module fails using the output module that has not failed until the failed module may be replaced.

In addition, monitoring an output module often requires adding an input module. Each channel of the output module is wired to both the remote device and a channel on the input module. The controller is then able to compare the state of each channel on the input module to the commanded state of the corresponding output channel. However, this method of monitoring the output module is not without drawbacks. First, the input module presents an additional expense. Additional wiring is also required between the output module and the input module. In addition, the input module itself may subsequently require monitoring to verify proper operation. Thus, it would be desirable to provide a system for monitoring the output module without the additional complexity and expense of a dedicated input module.

Some custom output modules have attempted to address these drawbacks by providing a signal back to the controller which monitors the state of the output or that provide a means for testing whether the output channel can transition between states. However, such output modules require custom software be developed to monitor the additional signal, perform the test, and to monitor the results of the test. Developing custom software adds to the cost and complexity of the safety system. Further, custom software is more likely to include errors and to require increased debugging and startup expense than a standardized software routine. Thus it would be desirable to provide a standard controller and output module that satisfy the SIL requirements without the added cost or complexity of developing custom software.

BRIEF DESCRIPTION OF THE INVENTION

The present invention provides a termination board for connecting remote devices to digital output signals from a controller, such as a programmable logic controller, for a safety system. The termination board simplifies wiring between the output modules and the remote devices. The operation of the output modules may be monitored and tested by the controller to satisfy SIL2 safety requirements. In addition, the output termination board provides a means to remove power from an output module having a fault condition.

In one embodiment of the invention, an output termination device for use in a safety system having at least one industrial controller, a first output module, a second output module, and at least one additional output module is disclosed. The output termination device includes a circuit board and a first switch mounted on the circuit board and configured to connect to a first output channel on one of the additional output modules to selectively supply a DC voltage to the first output module. The output termination device also includes a second switch mounted on the circuit board and configured to connect to a second output channel on one of the additional output modules to selectively supply the DC voltage to the second output module. A first output module connector is mounted on the circuit board and configured to receive each of the channels from the first output module, and a second output module connector is mounted on the circuit board and configured to receive each of the channels from the second output module. The output termination device also includes a field device connector mounted on the circuit board which has multiple terminals. Each terminal is configured to be connected to a remote device and each terminal is connected to the first output module connector and the second output module connector.

Thus, it is a feature of this invention that the output termination device provides modular connection of redundant output modules for use in a safety controller. The modular nature of the termination device reduces installation time and cost. Further, the output termination provides a switch that may be used to remove power from one of the output modules in the event of a failure, permitting fault tolerant operation of the safety controller.

As another aspect of the invention, the first switch is a relay mounted on the circuit board. The first relay has a first contact and a first coil. The first coil selectively enables and disables the first contact to supply the DC voltage to the first output module. The second switch is also a relay mounted on the circuit board. The second relay has a second contact and a second coil. The second coil selectively enables and disables the second contact to supply the DC voltage to the second output module. Each of the coils are controlled by a program executing on the controller.

Thus, it is another feature of this invention to provide a robust switch to control the DC voltage connected to each of the paired output modules.

As still another aspect of this invention, the output termination device includes a first cable having preterminated ends removably connected to the first output module connector at a first end and the first output module at a second end. The output termination device also includes a second cable having preterminated ends removably connected to the second output module connector at a first end and the second output module at a second end.

Thus, it is another feature of this invention to provide cabling between the circuit board and the output modules as another component in the modular controller. Industrial controllers, including safety controllers, are typically preconfigured, such that the number and location of output modules are known. The output termination device may similarly be preconfigured, such that the length and number of required cables is known and may be provided as another modular component.

In another embodiment of the invention, a safety control system includes a controller, a first output module in communication with the controller and having a plurality of output channels, a second output module in communication with the controller and having a plurality of output channels, at least one additional output module in communication with the controller, and an output termination device. At least one output channel on the second output module is configured to provide an identical signal as a corresponding output channel on the first output module. The output termination device includes a circuit board and a first switch mounted on the circuit board and connected to a first output channel on one of the additional output modules to selectively supply a DC voltage to the first output module. The output termination also includes a second switch mounted on the circuit board and connected to a second output channel on one of the additional output modules to selectively supply the DC voltage to the second output module. A first output module connector is mounted on the circuit board and configured to receive each of the channels from the first output module, and a second output module connector is mounted on the circuit board and configured to receive each of the channels from the second output module. The output termination device also includes a field device connector mounted on the circuit board which has multiple terminals. Each terminal is configured to be connected to a remote device and each terminal receives a signal from a channel on the first output module via the first output module connector and a corresponding signal from a channel on the second output module via the second output module connector.

Thus, it is another feature of the invention that the output termination device is incorporated with other PLC modules to provide a safety control system.

As another aspect of the invention, the safety control system includes a program executing on the controller to sequentially initiate a pulse test on each of the pairs of output channels wherein one output channel is on the first output module and the second output channel is on the second output module. The program initiates the pulse test on one pair of output channels during each scan of the program and sets a fault state for either the first or the second output module if one of the output channels on the respective output module fails to transition during the pulse test. In addition, the program executing on the controller selectively enables and disables the first and second switches to supply or remove Dc voltage to the first and second output modules.

Thus, it is another feature of the invention, that the control system continuously monitors the condition of the output modules. If one of the output modules should fail, the controller posts a fault and may use the fault as a condition to remove power from the output module.

As still another aspect of the invention, the program executing on the controller performs the following steps: compares the actual state of each output channel to the commanded state for that output channel for each of the first and second output modules, and sets a fault state for the first or second output module if the actual state and the commanded state of one of the output channels on the output module do not match for a predetermined time interval.

Thus, it is another feature of the invention that the output modules echo the status of the commanded state for each output back to the controller and the controller uses the echoed status to verify proper operation of each output module.

The program also monitors each of the first and second output modules for a fault state and controls the first and second coil to remove the DC voltage from the faulted output module. The program may perform an ordered shut down of the system if a fault state is detected on either the first or second output module. Alternately, the program may continue execution using only the first or second output module that is not in the faulted state.

Thus, it is another feature of the invention that the safety control system is user configurable to operate either in a fail-safe or fault tolerant mode upon detection of a fault condition.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
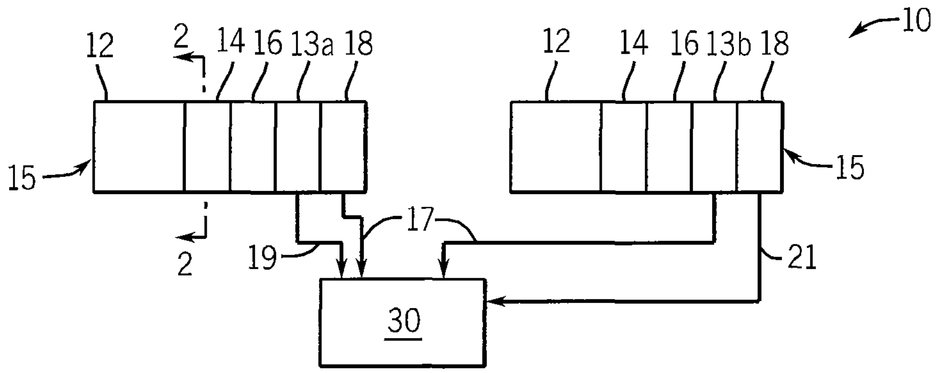
FIG. 1 is a block diagram of one embodiment of the safety control system according to the present invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word “connected,” “attached,” or terms similar thereto are often used. They are not limited to direct connection but include connection through other elements where such connection is recognized as being equivalent by those skilled in the art.

DETAILED DESCRIPTION OF THE PREFERRED EMBODIMENTS

Turning initially to FIG. 1, an exemplary embodiment of the safety control system 10 is shown having a dual controller 14 and dual rack 15 configuration. Each rack 15 includes a separate power supply 12, controller 14, input module 16 and output modules 18. Each of a pair of output modules 13 is connected to a termination device 30 by a cable 17. The cable 17 is preferably a multi-conductor cable pre-terminated at each end such that the cable 17 may be plugged into both the termination device 30 and one of the pair of output modules 13. The control system 10 further includes at least one additional output module 18. A first output signal 19 and a second output signal 21 are connected to the termination device 30. The first 19 and second 21 output signal may each be generated on a channel using the same output module 18 (not shown) or, alternately, may each be generated on a channel from separate output modules 18, as shown.

It is contemplated that the safety control system 10 may include many configurations as is known to one skilled in the art. For example, any number of input 16 or output 18 modules used may vary according to the configuration of the control system 10. The input 16 and output 18 modules can be plugged into or removed from the backplane 26 of the rack 15 for easy expandability and adaptability to configuration changes. Further, the control system 10 may employ a single controller 14 with multiple racks 15 or, alternately, a single controller 14 with a single rack 15 according to the requirements of the control system 10 and the safety standards for a specific application.

Figure 2:
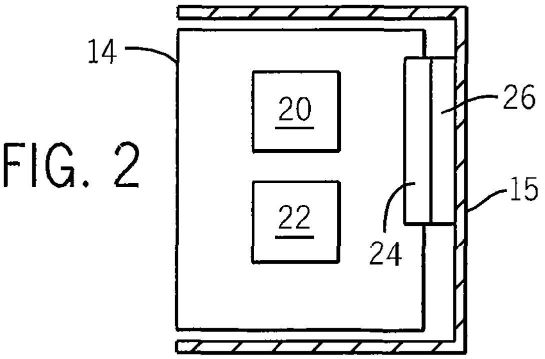
FIG. 2 is a partial block diagram of a cross-sectional view of the controller of FIG. 1.

Turning next to FIG. 2, the controller 14 includes a processor 20 and a memory device 22. The controller 22 includes a connector 24 and can be plugged into or removed from the backplane 26 of the rack 15. A program is stored in the memory device 22 and is executed on the processor 20. The controller 14 is preferably configured to communicate with the input modules 16 and the output modules 18 over the backplane 26. Alternately, any means known to one skilled in the art may be used to connect the controller 14 to input 16 and output 18 modules. For example a network, such as ControlNet, DeviceNet, or Ethernet/IP, may be used to connect the controller 14 and the input and output modules 16 and 18.

Figure 3:
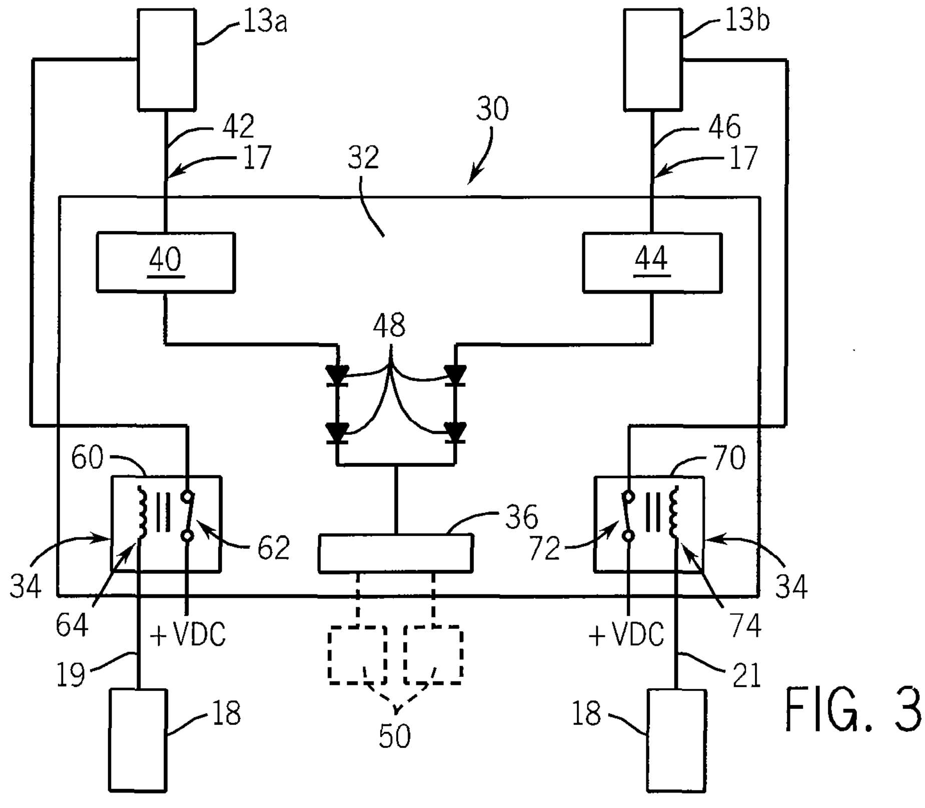
FIG. 3 is a schematic representation of one embodiment of the safety control system according to the present invention.
Figure 4:
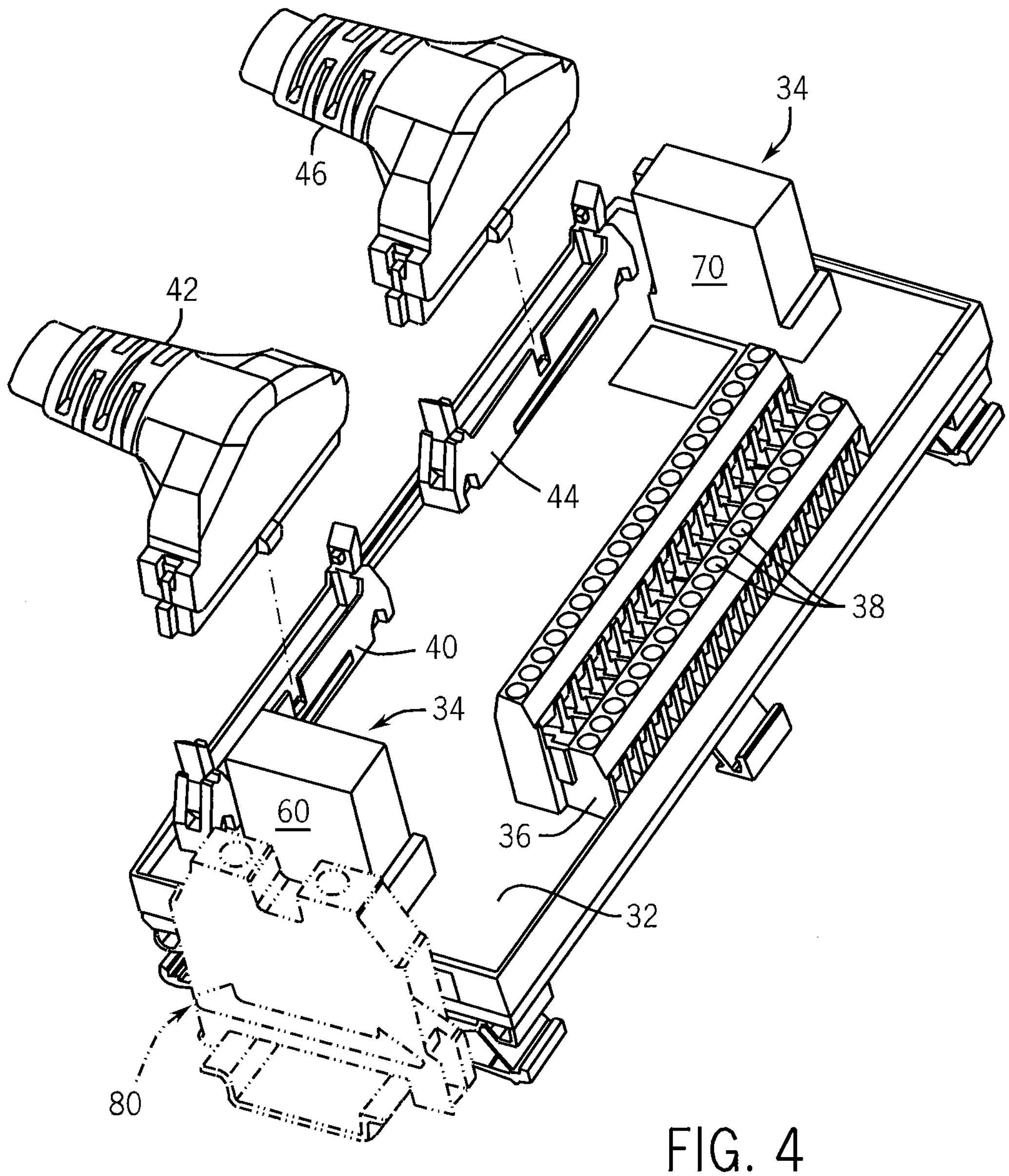
FIG. 4 is an isometric view of one embodiment of the output termination device according to the present invention.

Referring then to FIGS. 3 and 4, the output termination device 30 includes a circuit board 32 with two switches 34 mounted on the circuit board 32. It is contemplated that the circuit board 32 is a sheet of material used for mounting and interconnecting components, including, but not limited to, a single board, multiple boards, a printed circuit board, a through-hole board, or any other material known to one skilled in the art on which to mount and interconnect components. The switches 34 are preferably relays 60 and 70, but alternately may be a solid state switch, such as a transistor, or any other device suitable for selectively enabling a DC voltage, such as 24 volts DC, on the circuit board 32. A first output signal 19 connects an output module 18 to the coil 64 of the first relay 60. The contact 62 of the first relay 60 is connected in series between the DC voltage source (+VDC) and the first of the paired output modules 13*a* in order to selectively provide the DC voltage powering the output module 13*a*. A second output signal 21 connects an output module 18 to the coil 74 of the second relay 70. The contact 72 of the second relay 70 is connected in series between the DC voltage source (+VDC) and the second of the paired output modules 13*b* in order to selectively provide the DC voltage powering the output module 13*b*.

The safety control system 10 further includes a first 42 and a second 46 cable connecting the first 13*a* and the second 13*b* of the paired output modules to a first connector 40 and a second connector 44, respectively. Each of the first 40 and second 44 connectors are mounted on the circuit board 32. The first 42 and second 46 cables are preferably multi-conductor cables with pre-terminated connectors on each end such that the each cable 42 and 46 may plug directly into one of the paired output modules 13 and the respective connector 40 and 44. By providing pre-terminated cables 42 and 46 between the pair of output modules 13 and the output termination device 30 the complexity and number of wiring connections in the safety control system 10 is significantly reduced. It is further contemplated that the cables 42 and 46 may carry multiplexed or serial communication signals to reduce the number of conductors within the cable by adding the appropriate driver hardware to the circuit board 32 and paired output modules 13.

The output termination device 30 also includes a field connector 36 mounted on the circuit board 32. The field connector 36 preferably includes one terminal 38 for each of the channels available on one of the paired output modules 13. Each terminal 38 may be a screw-type or screwless terminal block as is known in the art. The field connector 36 is connected to both the first 40 and second 44 connectors. Each terminal 38 on the field connector 36 receives the output signal from one of the channels on the first of the paired output modules 13*a* and the corresponding output signal from one of the channels on the second of the paired output modules 13*b*. Isolation diodes 48 are preferably connected in series with each of the signals between the first 40 and second 44 connectors and the field connector 36. The diodes 48 are biased to conduct signals between the first 40 and second 44 connectors and the field connector while preventing signals from conducting in the reverse direction or from conducting between the first 40 and second 44 connectors. Each terminal 38 on the field connector 36 is then connected to a remote device 50, providing the output signal from the output modules 13 to the device 50.

The safety control system 10 is typically mounted within an enclosure. Therefore, the output termination device 30 preferably includes a connector 80 for mounting the output termination device 30 to a DIN rail. Alternately, the output termination device 30 may have other mounting means, for example holes extending through the circuit board 32 for connecting the device 30 to stand-offs, as is known in the art. The DIN rail connector 80, in coordination with the pre-terminated cables 42 and 46 and the paired output modules 13, provide a generally modular connection for providing redundant output modules 13 in a safety control system 10, reducing the time and expense involved with commissioning the safety control system 10.

In operation, two output modules, 13*a* and 13*b*, are configured to provide redundant output signals. Each pair of output channels on the output modules 13*a* and 13*b* may be selectively configured to either provide a redundant output signal or to remain disabled. At least one channel on the first output module 13*a* and the corresponding channel on the second output module 13*b* are configured to output the same signal such that both channels remain substantially in the same state, on or off. The electrical rating of each of the pair of output modules 13 is sufficient to drive each of the remote devices 50 connected to the field connector 36. Consequently, the control system 10 may continue operation using one of the pair of output modules 13 in the event the other one of the pair of output modules 13 should fail.

The output termination device 30 along with the pair of output modules 13 and the program executing on the processor 20 provide safety outputs for the safety control system 10. A safety output includes two output channels, each from one of the pair of modules 13, connected to a single remote device 50. The safety output is formed by transmitting a signal from each of the two output channels to the first 40 and second 44 connectors on the output termination device 30 using the preterminated cables 42 and 46. Each of the redundant signals from the first 40 and second 44 connectors is then passed through at least one isolation diode 48. After passing through the isolation diode 48, the redundant signals are connected, creating a single output signal. Connecting the two signals has the effect of performing a logical OR on the signals. The single output signal is then connected to one of the terminals 38 on the field connector 36. The terminals 38 are, subsequently, connected to a remote device 50.

The program executing on the processor 20 performs several functions for verifying proper operation of the pair of output modules 13. The routines monitor the state of the output channels and periodically cause the output channels to transition between states while monitoring each channels to verify proper transitions between states. If the routines detect a fault condition on one of the output modules 13*a* or 13*b*, the safety control system 10 may alternately initiate a controlled shut down of the process or continue operation in a fault-tolerant mode of operation using the output module 13*a* or 13*b* that is not in a fault condition. By including these verification routines along with the output modules 13, custom programming of these functions is eliminated, reducing startup and commissioning time and expense. In addition, the verification routines help the safety control system 10 meet the SIL2 safety requirements.

The program monitors the state of each of the output channels on the pair of output modules 13 which have been configured for redundant operation. Each output module 13*a* and 13*b* provides an echo signal for each of the output channels, indicating the present state of the output channel. The echo signals may be read by the program executing in the processor 20 and compared against the commanded state of the respective output channel. If the echo signal for one of the output channels is in a different state than the commanded state for a predetermined time, the program indentifies a fault condition for that output channel. The program may be configured to optionally enter a fail-safe or a fault-tolerant operation mode. The echo signals permit monitoring the state of the output channels without wiring each output channel to a separate input module.

The program is configured to execute a pulse test on the redundant output channels. The pulse test sends a command to a targeted output channel to transition between the present state (i.e. on or off) to the other state for a brief time and then back to the present state. The duration of the pulse is short enough such that a remote device 50 connected to the output channel, for example a relay, does not respond to the pulse. However, the electronic circuitry in the output channel is capable of transitioning between states in response to the pulse. The pulses are sent sequentially to each of the output channels on the paired output modules 13 such that one pair of output channels are tested during each scan of the program. Monitoring the echo signal in conjunction with the series of pulses, permits the program to verify that each of the output channels is capable of transitioning between states. If one of the output channels fails to transition in response to the pulse, the program identifies a fault condition for that output channel. The program may be configured to optionally enter a fail-safe or a fault-tolerant operation mode in response to identifying a fault condition on an output channel.

If the program identifies a fault state for any of the output channels, the program may either execute a controlled shut down or continue operating in a fault-tolerant mode. A controlled shut-down of the safety control system 10 is a fail-safe operating condition which allows the machine or process being monitored by the safety control system 10 to enter a safe state, preferably in a controlled manner that reduces stress and prevents damage of the machine or process. A safe state is determined according to the machine or process to be controlled and may be, but is not limited to, stopping a spinning motor, preventing an actuator from operating a press, or moving a robotic assembly to a predetermined location.

Alternately, the safety control system 10 may enter a fault-tolerant operating mode. Whether the controller enters the fail-safe or the fault-tolerant mode of operation upon detection of a fault state is preferably user configurable according to the requirements of the machine or process being monitored by the safety control system 10 or according to safety requirements.

If the safety control system 10 has been configured to operate in a fault-tolerant operating mode and a fault condition on at least one of the output channels of one of the output modules 13 has been identified, the process being monitored by the safety control system 10 is permitted to continue operation until a later point in time at which it is convenient to repair the faulted output module 13*a* or 13*b*. The safety control system 10 will remove power from the faulted output module 13*a* or 13*b* and permit the non-faulted output module 13*a* or 13*b* to continue providing output signals to the remote devices 50. The fault state may be announced to the operator, for example, by a light, horn, or alarm message, and, optionally, a timer may begin counting down. The control system 10 may be configured to optionally permit execution in the fault-tolerant mode of operation until the faulted output module 13*a* or 13*b* is replaced or until the timer expires. It is also possible that a fault condition may initially be detected on both of the pair of output modules 13 or on the second of the pair of output modules 13 before the first has been replaced. If both output modules 13 have a fault condition at the same time, the safety control system 10 may initiate an immediate shut down of the monitored process.

The safety control system 10 permits fault-tolerant operation by controlling the switches 34 on the output termination device 30. In one embodiment, the switches 34 are each a relay 60 and 70. The coils 64 and 74 of each of the relays 60 and 70 are preferably configured to be energized to close the contacts 62 and 72 of each relay 60 and 70 to provide a DC supply voltage to each of the pair of output modules 13. If no fault condition is detected on either of the output modules 13, the control system 10 enables the first and second output signals 19 and 21 which, in turn, energize the coils 64 and 74 of the relays 60 and 70, providing the DC supply voltage to each of the output modules 13. If a fault condition is detected on one of the output modules 13*a* or 13*b*, the safety control system 10 disables the output signal 19 or 21 corresponding to the faulted output module 13*a* or 13*b*, removing the DC supply voltage from the faulted output module 13*a* or 13*b*. Because the paired output channels from the output modules 13 are combined by a logical OR, a signal from only one of the modules 13*a* or 13*b* will still provide the correct signal to the remote device 50. Removing the DC supply voltage from the faulted output module 13*a* or 13*b* will cause each of the output channels on the faulted module 13*a* or 3*b* to turn off, preventing any of the channels from erroneously remaining high and commanding a remote device 50 to energize.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention

We claim:

1. An output termination device for use in a safety system, the safety system having at least one industrial controller, a first output module, a second output module, and at least one additional output module, the output termination device comprising:

a circuit board;

a first switch mounted on the circuit board and configured to connect to a first output channel on one of the additional output modules to selectively supply a DC voltage to the first output module;

a second switch mounted on the circuit board and configured to connect to a second output channel on one of the additional output modules to selectively supply the DC voltage to the second output module;

a first output module connector mounted on the circuit board configured to receive each of the channels from the first output module;

a second output module connector mounted on the circuit board configured to receive each of the channels from the second output module; and a field device connector mounted on the circuit board having a plurality of terminals, each terminal configured to be connected to a remote device, wherein each terminal is connected to the first output module connector and the second output module connector.

2. The output termination device of claim 1 wherein the first switch is a first relay mounted on the circuit board having a first contact and a first coil wherein the first coil selectively enables and disables the first contact to supply the DC voltage to the first output module; and the second switch is a second relay mounted on the circuit board having a second contact and a second coil wherein the second coil selectively enables and disables the second contact to supply the DC voltage to the second output module.

3. The output termination device of claim 2 wherein each of the first and second coils are selectively enabled and disabled by a program executing on the controller to control the first and second output channels on the additional output module.

4. The output termination device of claim 1 further comprising:

a first cable having preterminated ends removably connected to the first output module connector at a first end and the first output module at a second end; and a second cable having preterminated ends removably connected to the second output module connector at a first end and the second output module at a second end.

5. The output termination device of claim 1 further comprising a plurality of isolation diodes, each isolation diode connected in series between one of the channels on the first and second output module connectors and one of the terminals on the field device connector.

6. The output termination device of claim 1 further comprising a DIN rail connector attached to the circuit board.

7. A safety control system comprising:

a controller;

a first output module in communication with the controller and having a plurality of output channels;

a second output module in communication with the controller and having a plurality of output channels wherein at least one output channel on the second output module is configured to provide an identical signal as a corresponding output channel on the first output module;

at least one additional output module in communication with the controller; and an output termination device further comprising:

a circuit board;

a first switch mounted on the circuit board and connected to a first output channel on one of the additional output modules to selectively supply a DC voltage to the first output module;

a second switch mounted on the circuit board and connected to a second output channel on one of the additional output modules to selectively supply the DC voltage to the second output module;

a first output module connector mounted on the circuit board configured to receive each of the channels from the first output module;

a second output module connector mounted on the circuit board configured to receive each of the channels from the second output module; and a field device connector mounted on the circuit board having a plurality of terminals, each terminal configured to be connected to a remote device, wherein each terminal receives a signal from a channel on the first output module via the first output module connector and a corresponding signal from a channel on the second output module via the second output module connector.

8. The safety control system of claim 7 further comprising:

a first cable having preterminated ends removably connected to the first output module connector at a first end and the first output module at a second end; and a second cable having preterminated ends removably connected to the second output module connector at a first end and the second output module at a second end.

9. The safety control system of claim 7 further comprising a plurality of isolation diodes, each isolation diode connected in series between one of the channels on the first and second output module connectors and one of the terminals on the field device connector.

10. The safety control system of claim 7 further comprising a DIN rail connector attached to the circuit board.

11. The safety control system of claim 7 wherein the first switch is a first relay mounted on the circuit board having a first contact and a first coil wherein the first coil selectively enables and disables the first contact to supply the DC voltage to the first output module; and the second switch is a second relay mounted on the circuit board having a second contact and a second coil wherein the second coil selectively enables and disables the second contact to supply the DC voltage to the second output module.

12. The safety control system of claim 7 wherein each of the first and second switches are selectively enabled and disabled by a program executing on the controller.

13. The safety control system of claim 12 wherein the program executing on the controller sequentially initiates a pulse test on each of the pairs of corresponding output channels.

14. The safety control system of claim 13 wherein the program initiates the pulse test on one pair of output channels each program scan.

15. The safety control system of claim 14 wherein the program sets a fault state for either the first or the second output module if one of the output channels on the respective output module fails to transition during the pulse test.

16. The safety control system of claim 7 wherein a program executing on the controller performs the steps comprising:

comparing the actual state of each output channel to the commanded state for that output channel for each of the first and second output modules, and setting a fault state for the first or second output module if the actual state and the commanded state of one of the output channels on the output module do not match for a predetermined time interval.

17. The safety control system of claim 16 wherein the program monitors each of the first and second output modules for a fault state and controls the first and second coil to remove the DC voltage from the faulted output module.

18. The safety control system of claim 17 wherein the program performs an ordered shut down of the system if a fault state is detected on either the first or second output module.

19. The safety control system of claim 17 wherein the program continues execution using only the first or the second output module that is not in the fault state.

* * * * *